United States Patent [19]

Backof, Jr.

[11] 4,446,565

[45] May 1, 1984

[54] CVSD TRANSMISSION WITH IMPROVED INTELLIGIBILITY OF VOICE SIGNALS

[75] Inventor: Charles A. Backof, Jr., Hoffman Estates, Ill.

[73] Assignee: Motorola, Inc., Schaumburg, Ill.

[21] Appl. No.: 221,187

[22] Filed: Dec. 30, 1980

[51] Int. Cl.³ .............................................. H03K 13/22
[52] U.S. Cl. .................................... 375/32; 332/11 D; 381/31
[58] Field of Search ........................ 375/22, 27, 28, 29, 375/30, 31, 32, 33; 179/15.55 R; 455/42, 43, 44, 45, 110, 116, 117; 332/9 R, 11 D, 18

[56] References Cited

U.S. PATENT DOCUMENTS

| | | | |
|---|---|---|---|
| 2,572,900 | 10/1951 | Winkler | 455/42 |
| 3,109,991 | 11/1963 | Ocko | 455/43 |
| 3,380,003 | 4/1968 | Bemmann | 375/22 |
| 3,538,246 | 5/1968 | Macovski et al. | 179/15.55 R |
| 3,609,551 | 9/1971 | Brown | 375/32 |
| 3,986,049 | 10/1976 | Campbell et al. | 333/14 |
| 3,999,137 | 12/1976 | Fucito | 328/167 |
| 4,016,496 | 5/1977 | Eastcott | 328/35 |
| 4,100,493 | 7/1978 | Dijkmans et al. | 375/30 |
| 4,109,203 | 8/1978 | Eggermont et al. | 332/11 D |
| 4,110,692 | 8/1978 | Pradal | 455/110 |
| 4,207,526 | 6/1980 | Abt | 455/110 |

Primary Examiner—Robert L. Griffin
Assistant Examiner—Stephen Chin
Attorney, Agent, or Firm—Joan Pennington; Edward M. Roney; James W. Gillman

[57] ABSTRACT

Voice signals subjected to differential modulation such as CVSD modulation are made more intelligible by differentiating an electrical analog of the voice signal, clipping peaks of the differentiated signal, integrating the clipped differentiated signal, and applying the integrated signal to a differential modulator such as a CVSD modulator.

9 Claims, 2 Drawing Figures

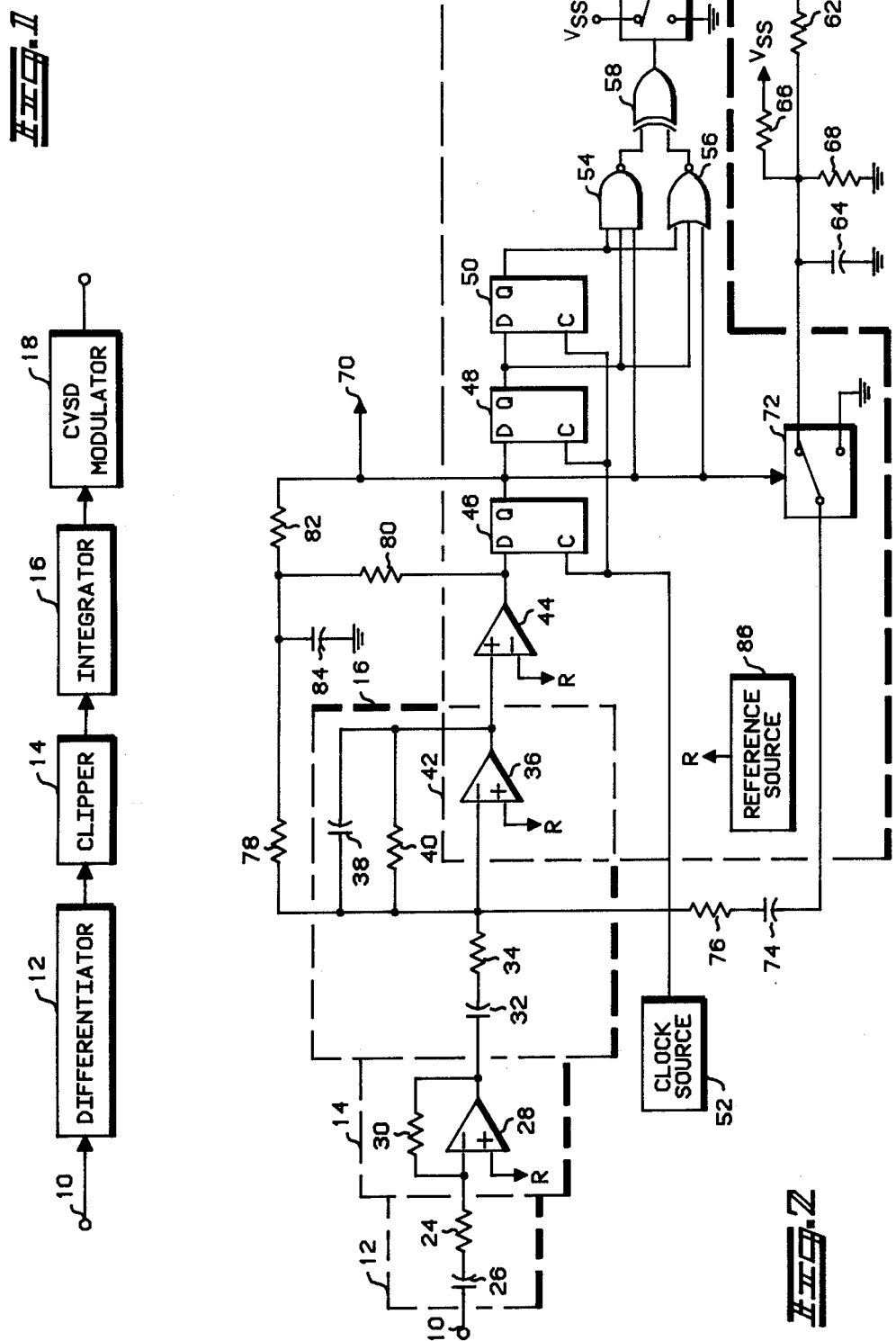

4,446,565

CVSD TRANSMISSION WITH IMPROVED INTELLIGIBILITY OF VOICE SIGNALS

BACKGROUND OF THE INVENTION

This invention relates to the encoding of voice signals by differential modulation such as differential pulse-code modulation (DPCM), delta modulation, or continuously variable-slope data (CVSD) modulation. In particular, it relates to a method and means of improving the intelligibility of voice signals that are subjected to differential modulation.

CVSD modulation is a well-known system for producing digitally encoded signals from analog signals. To perform the encoding, the analog signal is sampled at spaced intervals. In each of these intervals a reconstructed signal is compared with the analog signal. If the analog signal is bigger, a logical one is generated; if the analog signal is smaller, a logical zero is generated. The resulting bit stream is integrated in time to determine the signal that is compared to the analog signal. As described so far, the system is Delta Modulation which features integration with a constant slope. When that slope is made variable according to a rule, the result is CVSD modulation. The rule is normally applied to cause a change in the slope of the comparison curve after a predetermined consecutive number of intervals indicate a change in the same direction.

The principal objective of using CVSD modulation is to encode voice signals for broadcast at relatively low bit rates. In such a system, the bit rate is normally fixed, and it is necessary to design the operating characteristics of the system to deal effectively with a desired dynamic range and a desired frequency spectrum. It is evident that for a fixed signal level the maximum slope of an audio signal is a function of the high-frequency components in the signal and for a given audio waveform the maximum slope is a function of the strength of the signal. This is summarized in the statement that CVSD modulation has a decrease in the usable dynamic range with an increase in frequency, and vice versa. In contrast, there is no particular correlation between the loudness or softness with which a speaker addresses a microphone and the frequency content of the signal that he or she delivers to the microphone.

It is an object of the present invention to match the characteristics of different speakers more closely to the characteristics of CVSD modulation.

It is a further object of the present invention to improve the intelligibility of voice signals that are subjected to CVSD modulation.

Other objects will become apparent in the course of a detailed description of the invention.

SUMMARY OF THE INVENTION

A voice signal in electrical analog form is differentiated, clipped, integrated and applied to a CVSD modulator.

BRIEF DESCRIPTION OF THE DRAWINGS

FIG. 1 is a functional block diagram of a circuit for the practice of the present invention.

FIG. 2 is a circuit diagram of a circuit for the practice of the present invention.

DETAILED DESCRIPTION OF THE INVENTION

FIG. 1 is a functional block diagram showing the circuit functions that combine to form the present invention. In FIG. 1 an AC electrical signal that carries voice information from a microphone or the like enters at terminal 10 and is applied to a differentiator 12. The output of differentiator 12 is connected to clipper 14 which limits peaks of the signal from differentiator 12 to a maximum value. The output of clipper 14 is applied to integrator 16 which integrates the clipped signal to provide a processed signal that is then coupled to CVSD modulator 18. It has been observed that the processed signal is more intelligible to a listener than the same signal without such processing.

FIG. 2 is a detailed circuit realization of the present invention. In FIG. 2, terminal 10 receives voice signals from a microphone or other source. The signal at terminal 10 is applied to differentiator 12 which is a series combination of a resistor 24 and a capacitor 26 that comprises a high-pass filter with a crossover near the upper end of the desired voice band. Differentiator 12 may be a network installed especially for the purpose or it may be a pre-emphasis network of the type that is normally used in processing voice signals for FM broadcasts. The output of differentiator 12 is taken to clipper 14 which is an operational amplifier 28 with a feedback resistor 30 that comprises an amplifier. The gain of the amplifier is chosen so that the amplifier saturates on peaks, clipping them. The clipped output of clipper 14 is applied to integrator 16 which includes blocking capacitor 32 and series resistor 34 in cascade with the input to operational amplifier 36. Integrating capacitor 38 and its paralleled resistor 40 are placed in a feedback configuration around operational amplifier 36. If necessary to maintain band limitations, a low-pass filter could be placed between clipper 14 and integrator 16. A chip boundary 42 is shown here to indicate that certain of the components in FIG. 2 are well adapted to be included in an integrated circuit. The resistors 24, 30, 34 and 40, and capacitors 26, 32 and 38 are most easily realized as discrete components, and they are therefore shown as being outside the chip boundary 42. Operational amplifier 28 is here shown off the chip because it has been built and operated that way. A designer might equally as well choose to include operational amplifier 28 on the chip.

The remaining components in FIG. 2, together with integrator 16, constitute a CVSD modulator with a rule of three. This means that three consecutive pulses in the same direction call for an increase in the magnitude of the slope. The output of operational amplifier 36 is taken as an input to limiter 44. The output of limiter 44 is taken as an output to the first of three cascaded flip-flops 46, 48 and 50, each of which is clocked by a pulse from clock source 52. Outputs from each of the flip-flops 46, 48 and 50 are taken as inputs both to a NAND gate 54 and to a NOR gate 56. The outputs of NAND gate 54 and NOR gate 56 are applied as inputs to EXCLUSIVE-OR gate 58 which operates analog switch 60 whenever there are three consecutive pulses in the same direction. When the three consecutive pulses indicate that the CVSD slope is too low, analog switch 60 connects the voltage $V_{ss}$ through a resistor 62 to capacitor 64 to increase the voltage on capacitor 64 to a higher value. On the other hand, if three consecutive pulses in flip-flops 46, 48 and 50 indicate that the CVSD slope is too high, then analog switch 60 connects a ground at one end of resistor 62, tending to discharge capacitor 64 and reduce the integrating slope. The voltage on capacitor 64 is also determined partly by the voltage divider of resistors 66 and 68 on voltage $V_{ss}$. Resistor 66 sets the minimum slope, and resistor 68 sets the maximum.

The output of flip-flop 46 is the CVSD signal which appears at terminal 70. That signal is also applied to analog switch 72 to select a feedback voltage as an additional input to integrator 36 through a series capacitor 74 and resistor 76. When the output of flip-flop 46, the CVSD signal, is high, analog switch 72 is connected to apply the voltage of capacitor 64 as an input to integrator 36 through series capacitor 74 and resistor 76, causing the circuit to integrate down. When the output of flip-flop 46 is low, analog switch 72 is grounded, causing the circuit to integrate up. Operational amplifier 36 and integrating capacitor 38 thus do double duty, serving both as an integrator for processing the audio signal and as a CVSD integrator with a variable slope that is determined by the controlled voltage across capacitor 64.

Balancing resistors 78, 80 and 82 and by-pass capacitor 84 are shown here because they are useful for equalizing DC potentials in the circuit. A common reference source 86 applies an appropriately chosen reference voltage to one terminal of each of the operational amplifiers 28 and 36 and limiter 44. Reference source 86 is assumed to have adequate filtering to decouple the operational amplifiers from each other.

The values of resistors and capacitors are not shown in FIG. 2 because their selection is believed to be obvious to a skilled designer who is aware of their functions. However, the values actually used in a realization of the circuit are listed in the Table. Those values were used in a circuit that was designed to process speech in a frequency band from 300 Hz to 3 kHz. The corner frequency for differentiator 12 was set at 5 kHz, and clock source 52 was operated at 12 kHz. The operational amplifiers, flip-flops, and gates were custom-designed in complementary metal-oxide semiconductor (CMOS) circuits.

TABLE

| Element | Element Number | Value |
|---|---|---|
| Resistor | 24 | 6.8K |
|  | 30 | 560K |
|  | 34 | 12K |
|  | 40 | 470K |
|  | 62 | 6.8K |
|  | 66 | 120K |
|  | 68 | 6.8K |
|  | 76 | 47K |
|  | 78 | 220K |
|  | 80 | 470K |
|  | 82 | 470K |
| Capacitor | 26 | 4700 pF |
|  | 32 | 0.05 μF |
|  | 38 | 0.002 μF |
|  | 64 | 1 μF |
|  | 74 | 0.01 μF |
|  | 84 | 0.015 μF |

I claim:

1. A method of improving intelligibility in a system having as an input an electrical analog of a voice signal that is limited to a passband and that is subjected to CVSD modulation, the method matching characteristics of different speakers more closely to characteristics of CVSD modulation, the method comprising the steps of:

a. differentiating the electrical analog by applying same to a high pass filter having a crossover above the passband to produce a differentiated signal;
   b. clipping the differentiated signal to produce a substantially symmetrical clipped differentiated signal;
   c. integrating the clipped differentiated signal by applying same to a low pass filter having a crossover below the passband to produce a preprocessed signal whose frequency components outside the passband are substantially attenuated relative the frequency components within the passband; and
   d. applying the preprocessed signal to a CVSD modulator, of the type which produces a digitally encoded bit stream representative of an analog input, whereby said digitally encoded bit stream provides improved intelligibility.

2. A circuit for improving intelligibility of a CVSD system having as an input an electrical analog of a voice signal that is limited to a passband, the circuit matching characteristics of different speakers more closely to characteristics of CVSD modulation, the circuit comprising in combination:

a high-pass filter having a corner frequency above the passband of the voice signal, the high-pass filter serving as a differentiator receiving the electrical analog and producing a differentiated signal;
   a clipper comprising at least one complementary metal-oxide semiconductor (CMOS) operational amplifier with a feedback resistor and connected to the differentiator and receiving the differentiated signal to produce a clipped differentiated signal;
   an integrator comprising at least one complementary metal-oxide semiconductor (CMOS) operational amplifier with a feedback capacitor and connected to the clipper and receiving the clipped differentiated signal to produce a preprocessed signal; and
   a CVSD modulator comprising complementary metal-oxide semiconductor (CMOS) operational amplifiers, flip-flops and gates and connected to the integrator and receiving the preprocessed signal to produce a CVSD signal which CVSD signal has improved intelligibility.

3. The method of claim 1 comprising in addition the step of limiting bandwidth of the electrical analog of the voice signal to a passband to produce a band-limited electrical analog.

4. The method of claim 3 wherein the step of differentiating comprises applying the band-limited electrical analog to a high-pass filter having a crossover frequency above the passband.

5. The method of claim 3 or 4 wherein the step of clipping comprises substantially clipping some but not all peaks of the differentiated signal.

6. A circuit for improving intelligibility of a CVSD system having as an input an electrical analog of a voice signal that is limited to a passband, the circuit matching characteristics of different speakers more closely to characteristics of CVSD modulation, the circuit comprising in combination:

a high-pass filter having a corner frequency above the passband of the voice signal, the high-pass filter serving as a differentiator receiving the electrical analog and producing a differentiated signal;
   a clipper connected to the differentiator and receiving the differentiated signal to produce a substantially symmetrical clipped differentiated signal;

a low-pass filter having a corner frequency below the passband of the voice signal, the low-pass filter serving as an integrator connected to the clipper and receiving the substantially symmetrical clipped differentiated signal to produce a preprocessed signal; and a CVSD modulator of the type which produces a digitally encoded bit stream representative of an analog input, said modulator being connected to the integrator and receiving the preprocessed signal to produce a digitally encoded bit stream providing improved intelligibility.

7. The circuit of claim 6 wherein the clipper comprises an amplifier operated to saturate on selected peaks of the differentiated signal.

8. The circuit of claim 6 wherein the integrator comprises an operational amplifier with a feedback capacitor.

9. The circuit of claim 6 wherein the high-pass filter comprises a series RC circuit.

* * * * *

UNITED STATES PATENT AND TRADEMARK OFFICE
CERTIFICATE OF CORRECTION

PATENT NO. : 4,446,565

DATED : May 1, 1984

INVENTOR(S) : CHARLES A. BACKOF

It is certified that error appears in the above-identified patent and that said Letters Patent is hereby corrected as shown below:

In Claim 5, column 4, line 54, after "substantially" insert --symmetrical--.

In Claim 7, column 6, line 3, after "the" insert --substantially symmetrical--.

Signed and Sealed this

Sixteenth Day of October 1984

[SEAL]

Attest:

Attesting Officer

GERALD J. MOSSINGHOFF

Commissioner of Patents and Trademarks